US010043378B2

(12) United States Patent
Otis et al.

(10) Patent No.: US 10,043,378 B2
(45) Date of Patent: Aug. 7, 2018

(54) SYNCHRONIZATION OF WIRELESSLY CONTROLLED NOTIFICATION DEVICES USING WIRELESS COMMUNICATION

(71) Applicant: Honeywell International Inc., Morristown, NJ (US)

(72) Inventors: Jesse J. Otis, North Haven, CT (US); Gourav Sharma, Bangalore (IN); Andrew G. Berezowski, Wallingford, CT (US); Shreelatha M, Bangalore (IN)

(73) Assignee: HONEYWELL INTERNATIONAL INC., Morristown, NJ (US)

( * ) Notice: Subject to any disclaimer, the term of this patent is extended or adjusted under 35 U.S.C. 154(b) by 98 days.

(21) Appl. No.: 14/926,246

(22) Filed: Oct. 29, 2015

(65) Prior Publication Data

US 2017/0124854 A1 May 4, 2017

(51) Int. Cl.

| | |
|---|---|
| ***G08B 27/00*** | (2006.01) |
| ***G08B 25/10*** | (2006.01) |
| ***G08B 25/14*** | (2006.01) |
| ***G08B 3/10*** | (2006.01) |
| ***G08B 5/22*** | (2006.01) |
| ***G08B 17/00*** | (2006.01) |

(52) U.S. Cl.

CPC ............... *G08B 27/00* (2013.01); *G08B 3/10* (2013.01); *G08B 5/22* (2013.01); *G08B 17/00* (2013.01); *G08B 25/10* (2013.01); *G08B 25/14* (2013.01); *H05K 999/99* (2013.01)

(58) Field of Classification Search

CPC ..... H04W 56/004; G08B 25/10; G08B 17/00; G08B 17/10; G08B 17/12

See application file for complete search history.

(56) References Cited

U.S. PATENT DOCUMENTS

| | | | | |
|---|---|---|---|---|
| 5,598,139 A | 1/1997 | Karim et al. | | |
| 5,850,178 A | 12/1998 | Ha et al. | | |
| 6,292,508 B1 * | 9/2001 | Hong .................. | H04B 1/7156 375/134 | |

(Continued)

OTHER PUBLICATIONS

Extended European search report for corresponding EP patent application 16194699.1, dated Feb. 16, 2017.

*Primary Examiner* — Hongmin Fan
(74) *Attorney, Agent, or Firm* — Husch Blackwell LLP

(57) ABSTRACT

An apparatus is provided that includes a control panel of a security system that protects a secured geographic area, a plurality of sensors, a plurality of annunciators, a processor that wirelessly exchanges information with the sensors and the annunciators based upon a timing table defining a repeating superframe having a plurality of non-overlapping time periods including at least one response period, at least one request period, and at least one silent period, a processor of the control panel that transmits an activation message to one of the plurality of annunciators within the response period of a first of the plurality of non-overlapping time periods, and a processor of the one of the plurality of annunciators that processes the activation message and directly synchronizes an audio or visible output of the one of the plurality of annunciators to a subsequent one of the plurality of non-overlapping time periods.

16 Claims, 1 Drawing Sheet

(56) References Cited

U.S. PATENT DOCUMENTS

| | | | | |
|---|---|---|---|---|
| 6,646,566 | B1 * | 11/2003 | Tanguay .................. | G08B 3/10<br>340/384.1 |
| 8,194,592 | B2 | 6/2012 | Kore et al. | |
| 2010/0079278 | A1 | 4/2010 | Suzuki et al. | |
| 2012/0163352 | A1 | 6/2012 | Bansal et al. | |
| 2015/0163758 | A1 * | 6/2015 | Frison ................. | H04W 56/004<br>370/350 |

* cited by examiner

SYNCHRONIZATION OF WIRELESSLY CONTROLLED NOTIFICATION DEVICES USING WIRELESS COMMUNICATION

FIELD

The field of invention relates to fire systems and, more particularly, to the activation of warning devices in a fire system.

BACKGROUND

Fire detection systems are generally known. Such systems are typically based upon the use of a number of fire detectors dispersed throughout a building and at least one warning device that warns occupants of the building about a presence of a fire. While each of the fire detectors could be connected to its own warning device, the fire detectors are typically connected to a common monitoring panel. This is useful because a local warning device connected to its own fire sensor may not be loud enough to be heard in other areas of the building. On the other hand, the use of a central monitoring panel allows all warning devices to be activated when the fire is present in any one area of the building. This is also useful because of the need to send a notice of any detected fire to a central monitoring station.

However, the use of the common monitoring panel requires that a connection be established and maintained between the common monitoring panel each of the fire detectors and between the common monitoring panel and each of the warning devices. In the past, the connection was established by installing at least two wires between each of the fire detectors and the common monitoring panel and between each of the warning devices and the common monitoring panel.

More recent systems have relied upon the use of wireless transceivers to reduce the costs of installation. Such systems require a transceiver located in each of the fire detectors, each of the warning devices, and the central monitoring panel.

Still other systems have relied upon wireless transceivers within one or more of the fire detectors to relay signals from other sensors in a mesh network. While these systems work well, they often introduce delays that could lead to unacceptable behaviors, such as the warning devices not being synchronized. Accordingly, a need exist for better methods of controlling such systems.

DETAILED DESCRIPTION

Figure 1:
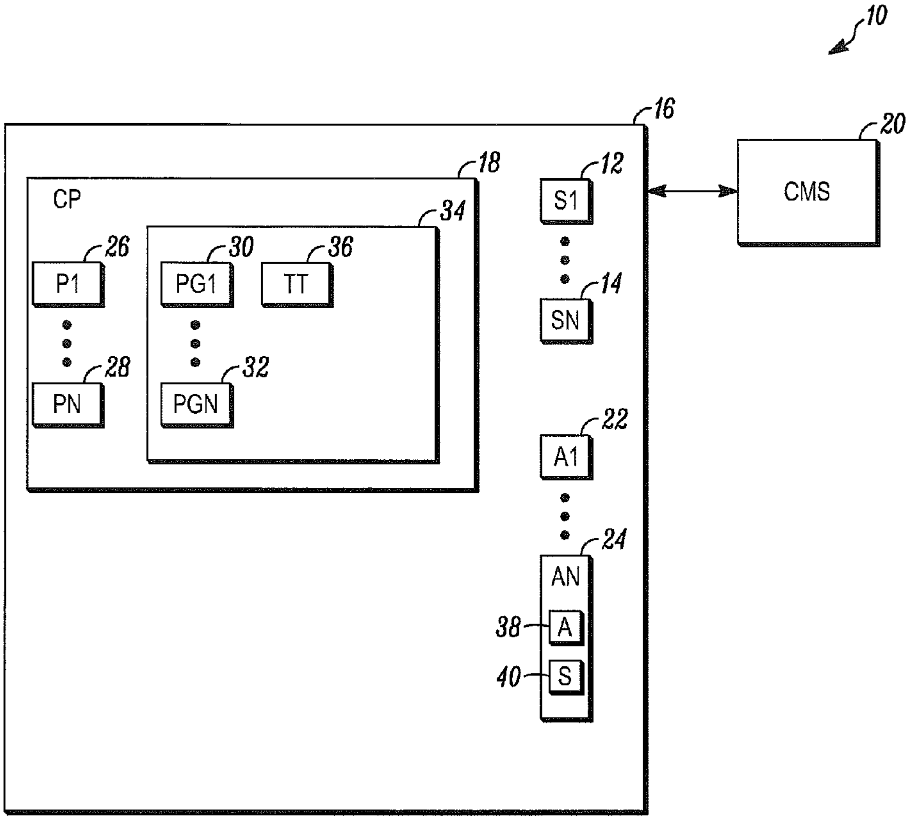
FIG. 1 is a block diagram of a security system in accordance herewith.

While disclosed embodiments can take many different forms, specific embodiments thereof are shown in the drawings and will be described herein in detail with the understanding that the present disclosure is to be considered as an exemplification of the principles thereof and the best mode of practicing the same and is not intended to limit the application or the claims to the specific embodiment illustrated.

FIG. 1 is a block diagram of a security system 10 shown generally in accordance with an illustrated embodiment.

Included within the security system are a number of wireless threat detectors 12, 14 that detect threats within a secured geographic area 16.

The threat detectors may be embodied in any of a number of different forms. For example, the threat detectors may be any combination of fire, smoke, and/or carbon monoxide detectors.

Some of the threat detectors may be intrusion sensors. In this case, the intrusion sensors may be switches placed on doors or windows allowing entrance into or egress from the secured geographic area. Others of the intrusion sensors may be passive infrared (PIR) sensors placed within an interior of the secured geographic area to detect intruders who have been able to circumvent intrusion sensors placed along a periphery of the secured geographic area. Still others of the intrusion sensors may be closed circuit television (CCTV) cameras with motion detection capability.

The threat detectors may be monitored by a control panel 18 either located within the secured geographic area as shown in FIG. 1 or located remotely. Upon activation of one of the threat detectors, the control panel may send an alarm message to a central monitoring station 20. The central monitoring station may respond by summoning the appropriate help (e.g., police, fire department, etc.).

Also distributed throughout the secured geographic area are a number of wireless warning devices (e.g., annunciators) 22, 24 that warn authorized human occupants of the threats detected within the secured geographic area.

Each of the annunciators may include one or more audible and/or visual warning devices. For example, the audible devices may be embodied as buzzers or speakers that emit an audible signal that warns the authorized human occupants of the secured geographic area of the threats detected. Where embodied as one or more of the speakers, the speakers may emit one or more words or sentences that warn the authorized human occupants of types of the threats involved, provide specific directions to direct people to exits, and/or provide specific verbal instructions of how to deal with the threats. Where embodied as the visual warning devices, the annunciators may include warning lights or strobes.

In addition to sending the alarm message to the central monitoring station, the control panel may also send a wireless activation message, including one or more instructions, to each of the annunciators. The instructions may activate all of the annunciators or only those annunciators near a geographic location of the threats detected. The instructions may include a specific audible instruction to be delivered through each of the annunciators activated.

Outputs of the annunciators activated are each independently synchronized to one another as described in more detail below. In this regard, synchronization of warning signals emitted by the annunciators is required under many local and national fire codes and regulations.

Included within the control panel, each of the threat detectors, and each of the annunciators is control circuitry that accomplishes the functionality described herein. The control circuitry may include one or more processor apparatuses (processors) 26, 28, each operating under control of one or more computer programs 30, 32 loaded from a non-transitory computer readable medium (memory) 34. As used herein, reference to a step of a computer program is also reference to a processor that executed that step.

In general, communication between the control panel and each the threat detectors and between the control panel and each of the annunciators occurs within the context of a repeating superframe. Under one illustrated embodiment, the repeating superframe includes at least one request time period, a least one silent time period, and at least one response time period. Under another illustrated embodiment, the repeating superframe includes at least one request time period and at least one response time period. Under still another illustrated embodiment, the repeating superframe includes only request time periods. The response time period is used by the control panel to send instructions to the threat detectors and the annunciators. The request time period is used by the threat detectors and the annunciators to send requests or responses to the control panel. The silent time period separates the request time period from the response time period and provides processing time in order to process and respond to the instructions.

Figure 2:
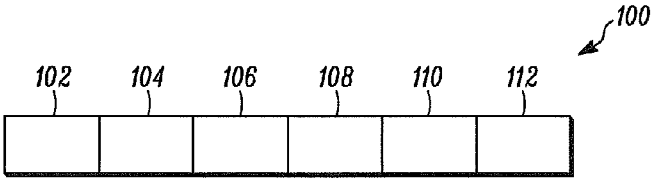
FIG. 2 is a diagram of a repeating superframe that may be used by the security system of FIG. 1.

FIG. 2 depicts an example of a repeating superframe 100 that may be used by the security system of FIG. 1. The repeating superframe of FIG. 2 includes a first request period 102, a first silent period 104, a second request period 106, a second silent period 108, a response period 110, and a third silent period 112.

The repeating superframe is defined within a timing table 36 within the control panel, each of the threat detectors, and each of the annunciators. Under one illustrated embodiment, the communication between the control panel and the threat detectors and between the control panel and the annunciators occurs under a time division multiple access (TDMA) format. Accordingly, each of the request and response time periods is divided into a number of TDMA slots.

One or more of the TDMS slots may be reserved for identification and control information. For example, the one or more of the TDMA slots may include a beacon that synchronizes the threat detectors and the annunciators to the repeating superframe. The beacon may also contain an identification of the security system and status information.

In the event that one of the threat detectors or the annunciators is too far from the control panel, that threat detector or annunciator may register with the control panel through another of the threat detectors or the annunciators. In this case, at least some of the threat detectors and/or the annunciators may arrange themselves into a mesh network under a parent-child relationship. In this regard, each father node receives data from its children and forwards such data packets and its own information to the control panel. Each child receives data from its fathers and forwards such data packets to its descendants. In this way, each node (threat detector or annunciator) can also be considered a repeater.

Turning now to the annunciators, in particular, the control panel activates the annunciators in response to detection of one of the threats within the secured area. In this regard, a processor of the control panel sends an activation instruction to each of the annunciators to be activated via the TDMA slots assigned to those annunciators. In some cases, some (or all) of the annunciators may have an audio transducer 38 and a visual strobe 40. In this regard, the audio transducer may be controlled independently of the visual strobe via a specific instruction transmitted in the TDMA slots assigned to those annunciators.

In addition, timing and content of audible and/or visual information provided via the audible transducer and the visual strobe may be defined by content of the activation instruction transmitted. In the case of a verbal word warning, the verbal word warning may be provided with the activation instruction transmitted or may be pre-stored within memory of the annunciators, where a location of the verbal word warning pre-stored is identified by the activation instruction transmitted.

It should be noted, in this regard, that synchronization of output devices (e.g., the audible transducer or the visual strobe of the annunciators) is accomplished independently of the activation instruction transmitted in the TDMA slots of the annunciators. This is necessary because each of the annunciators may be assigned to a different one of the TDMA slots of the repeating superframe. It may also be important to independently synchronize output of the annunciators delivering the same warning because other ones of the annunciators may be simultaneously delivering a different warning.

The synchronization of the audible transducer of each of the annunciators is accomplished by a synchronization processor of each of the annunciators sensing a beginning of a predefined time period of the repeating superframe and synchronizing a control signal (waveform) sent to the audible transducer based upon that time period. Under one embodiment, the synchronization processor synchronizes the audible transducer to the beginning of the repeating superframe.

An example may be offered regarding the control signal for the synchronization of the visual strobe. In this regard, the synchronization processor of each of the annunciators must charge a power source of the visual strobe before it can fire. Accordingly, the synchronization of the visual strobe involves the use of the waveform that first charges and then fires the visual strobe.

As a first example, timing of one of the annunciators having the visual strobe and an audible horn is considered. The waveform for firing the visual strobe will be considered first. The example may be set in the context of a time slotted communication system and in a mesh network where not every device wakes up to talk/listen at the same time. Each of the annunciators is assigned to a respective slot in which it is to listen or communicate. The communication is contained in the repeating superframe. The concept is to use superframe timing to establish strobe flashing times. The timing is triggered off of different states of the repeating superframe (e.g., silent phase 1, silent phase 2, etc.).

In an example of the one of the annunciators having the visual strobe and the audible horn using a Temporal 3 pattern and a superframe length of 3.00 seconds, the waveform may be described as follows. Strobe circuitry is activated by a hi-going control signal and begins charging when a command to do so is received by the one of the output devices (i.e., the one of the annunciators is activated by the activation instruction from the control panel in its assigned slot). A synchronization pattern has the following inflection points. From a start of the silent phase 1, the output to the visual strobe goes low at 30 milliseconds (ms). Then, the output goes high at 50 ms at which time the visual strobe fires.

In this example, the output goes low at 100 ms, but only in every fourth repeating superframe, and then high at 150 ms to restart the Temporal 3 pattern. Continuing with this example, the output goes low at 1050 ms and high at 1100 ms at which time the visual strobe fires again.

A second example may be offered of the visual strobe with the audible horn silenced. In this example, the output goes low at 100 ms and high at 200 ms to fire the visual strobe. Then, the output goes low at 1000 ms and high at 1100 ms to fire the visual strobe.

The second example may be continued with an offset from the silent phase 2. In this case, the output goes low at 70 ms and high at 110 ms to fire the visual strobe.

The advantage of the concept offered by this example is that clock correction that is already being performed to maintain the synchronization in the mesh network will naturally keep strobe flashes synchronized from device to device. The alternative is to have multiple strobes maintain the synchronization with a wired connector or a more complex wireless solution.

Turning now to the audible horn, there are two modes of operation regarding the activation of the audible horn. The first is a direct drive of a horn pattern via the activation instruction (i.e., when the output to the audible horn is high, the audible horn is on and when the output to the audible horn is low, the audible horn is off). The second mode of operation is where a predetermined horn pattern is saved in the memory (where a timer and a microprocessor on the audible horn create a predetermined pattern based on a synchronization pulse from a processor of the annunciators that starts the predetermined pattern).

The concepts described herein apply to both modes. In general, wireless superframe timing of the silent period is used to synchronize transition points for the horn patterns in order to ensure that all output devices in the security system that are using the same pattern are in synch with each other, assuming that they also have synchronization with their respective TDMA slots.

In the above examples, a pattern for "strobe with audible horn" falls into the second mode described above. The audible horn itself will create a predetermined "temporal 3" (temp 3) pattern, but relies on the synchronization pattern of the repeating superframe to provide an indication to start the synchronization pattern. In the examples above, every fourth repeating superframe is used to restart the synchronization pattern. The repeating superframe is 3 seconds long so every 12 seconds, one of the horn patterns restart.

In general, notification devices (i.e., annunciators) require synchronization to comply with regulatory and ADA requirements. In wired systems, the synchronization is maintained by using a wired communication connection that runs between the notification devices and that carries an analog synchronization pattern. In wireless systems, the synchronization of outputs is a challenge that would otherwise require constant communication between the notification devices to eliminate drift and repetitive activation commands.

The security system described above removes a need for the wired communication connection for the synchronization, avoids the need to have a synchronization routine that is asynchronous to a timing already being performed for instructions, and ensures notification synchronization by utilizing communication timing structures that are pre-existing due to the wireless communication network.

Various patterns required for output notification circuits are manipulated within an allocated tolerance to fit into a repetitive sequence that is aligned with an already tightly synchronized communication protocol. For example, a rising edge of a synchronization signal of the annunciators to a strobe output that is used to trigger a strobe flash is aligned to certain points in time in a communication routine (i.e., 20 ms after the start of a new state in the repeating superframe).

In general, a system includes a control panel of a security system that protects a secured geographic area, a plurality of sensors that detect threats within the secured geographic area, a plurality of annunciators within the secured geographic area that warns human occupants of the threats within the secured geographic area, a processor that wirelessly exchanges information with the sensors and the annunciators based upon a timing table saved at least within a memory of the control panel, the timing table defining a repeating superframe having a plurality of non-overlapping time periods including at least one response period used by the control panel to transmit instructions to each of the sensors and the annunciators, at least one request period used by at least some of the sensors and the annunciators to transmit the information to the control panel, and at least one silent period, a processor of the control panel that transmits an activation message to one of the annunciators within the response period of a first of the plurality of non-overlapping time periods, and a processor of the at least one of the annunciators that processes the activation message and directly synchronizes an audio or visible output of the at least one of the annunciators to a subsequent one of the plurality of non-overlapping time periods.

Alternatively, a system includes a control panel of a security system that detects threats within a secured geographic area, a plurality of annunciators within the secured geographic area that warns human occupants of the threats within the secured geographic area, a processor of the control panel that wirelessly exchanges information with the annunciators within a repeating superframe, wherein the repeating superframe includes a response period used by the control panel to transmit instructions to each of the annunciators, a request period used by at least some of the annunciators to transmit the information to the control panel, and a silent period, a processor of the control panel that transmits an activation message to one of the annunciators within the response period, and a processor of the at least one of the annunciators that processes the activation message and directly synchronizes an audio or visible output of the at least one of the annunciators to one of the plurality of non-overlapping time periods.

Alternatively, a system includes a control panel of a security system that protects a secured geographic area, a plurality of sensors within the secured geographic area that are wirelessly coupled to the control panel and that detect threats within the secured geographic area, a plurality of annunciators within the secured geographic area that are wirelessly coupled to the control panel and that warn human occupants of the threats detected within the secured geographic area, a processor of the control panel that wirelessly exchanges information with the sensors and the annunciators within a repeating superframe, wherein the repeating superframe includes a response period used by the control panel to transmit instructions to each of the sensors and to each of the annunciators, a request period used by at least some of the annunciators and the sensors to transmit the information to the control panel, and a silent period, a processor of the control panel that transmits an activation message to one of the annunciators within the response period, and a processor of the at least one of the annunciators that processes the activation message and directly synchronizes an audio or visible output of the at least one of the annunciators to the silent time period.

From the foregoing, it will be observed that numerous variations and modifications may be effected without departing from the spirit and scope hereof. It is to be understood that no limitation with respect to the specific apparatus illustrated herein is intended or should be inferred. It is, of course, intended to cover by the appended claims all such modifications as fall within the scope of the claims. Further, logic flows depicted in the figures do not require the particular order shown or sequential order to achieve desirable results. Other steps may be provided, steps may be eliminated from the described flows, and other components may be added to or removed from the described embodiments.

The invention claimed is:

1. An apparatus comprising:

a control panel of a security system that protects a secured area;

a plurality of sensors that detect threats within the secured area;

a plurality of annunciators within the secured area that warn of the threats within the secured area;

a first processor of the control panel that wirelessly exchanges information with the plurality of sensors and the plurality of annunciators based upon a timing table saved at least within a memory of the control panel, wherein the timing table defines a repeating superframe having a plurality of non-overlapping time periods including at least one response period used by the control panel to transmit respective instructions to each of the plurality of sensors and each of the plurality of annunciators, and wherein the information includes a respective activation message to each of the plurality of annunciators within a respective slot of the at least one response period; and a respective second processor of each of the plurality of annunciators that processes the respective activation message and directly synchronizes a respective local audio or visible output with respective remote audio or visual outputs of each of the plurality of annunciators by initiating the respective local audio or visual output upon sensing a beginning of one of different states of the repeating superframe.

2. The apparatus as in claim 1 wherein the different states of the repeating superframe include the at least one response period, at least one request period, and at least one silent period.

3. The apparatus as in claim 2 wherein the respective second processor of each of the plurality of annunciators synchronizes an activation of the respective local audio or visual output to the beginning of the at least one silent period.

4. The apparatus as in claim 1 wherein the respective second processor of each of the plurality of annunciators skips one or more of the different states of the repeating superframe before subsequently re-synchronizing the respective local audio or visual output.

5. The apparatus as in claim 3 wherein the respective second processor of each of the plurality of annunciators synchronizes the respective local audio or visual output during an integer multiple of the repeating superframe, and wherein the integer multiple is greater than one.

6. The apparatus as in claim 3 wherein the respective second processor of each of the plurality of annunciators synchronizes the respective local audio or visual output to the beginning of a second silent period within the repeating superframe.

7. The apparatus as in claim 1 wherein the respective second processor of each of the plurality of annunciators generates a respective waveform for the respective local audio or visual output.

8. An apparatus comprising:

a control panel of a security system that detects threats within a secured area;

a plurality of annunciators within the secured area that warn of the threats within the secured area;

a first processor of the control panel that wirelessly exchanges first information with the plurality of annunciators within a repeating superframe, wherein the repeating superframe comprises different states, including at least a response period used by the control panel to transmit respective instructions to each of the plurality of annunciators, a request period used by at least some of the plurality of annunciators to transmit second information to the control panel, and a first silent period, and wherein the first information includes a respective activation message to each of the plurality of annunciators within a respective slot of the response period; and a respective second processor of each of the plurality of annunciators that processes the respective activation message and directly synchronizes a respective local audio or visible output with respective remote audio or visual outputs of each of the plurality of annunciators by initiating the respective local audio or visual output upon sensing a beginning of one of the different states of the repeating superframe.

9. The apparatus as in claim 8 wherein the response period and the request period include a plurality of time division multiplexed slots.

10. The apparatus as in claim 8 further comprising a plurality of sensors that detect the threats within the secured area.

11. The apparatus as in claim 8 wherein the respective second processor of each of the plurality of annunciators synchronizes an activation of the respective local audio or visual output to the beginning of the first silent period.

12. The apparatus as in claim 8 wherein the respective second processor of each of the plurality of annunciators skips one or more of the different states of the repeating superframe before synchronizing the respective local audio or visual output.

13. The apparatus as in claim 12 wherein the respective second processor of each of the plurality of annunciators synchronizes the respective local audio or visual output during an integer multiple of the repeating superframe, and wherein the integer multiple is greater than one.

14. The apparatus as in claim 8 wherein the repeating superframe includes a second silent period.

15. The apparatus as in claim 14 wherein the respective second processor of each of the plurality of annunciators synchronizes the respective local audio or visual output to the beginning of the second silent period.

16. The apparatus as in claim 8 wherein the respective second processor of each of the plurality of annunciators generates a respective waveform for the respective local audio or visual output.

* * * * *